United States Patent
Ono

(10) Patent No.: US 6,791,342 B2
(45) Date of Patent: Sep. 14, 2004

(54) ELECTROSTATIC CAPACITANCE SENSOR

(75) Inventor: Atsushi Ono, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 10/125,353

(22) Filed: Apr. 19, 2002

(65) Prior Publication Data

US 2002/0171439 A1 Nov. 21, 2002

(30) Foreign Application Priority Data

May 21, 2001 (JP) ..................................... P2001-150331

(51) Int. Cl.⁷ .......................... G01R 27/26; H01G 7/00
(52) U.S. Cl. ....................... 324/658; 324/686; 324/687; 361/283.3; 361/283.4
(58) Field of Search ................................. 324/452, 658, 324/660, 686, 687, 688, 690; 345/157, 160; 361/271, 277, 278, 280, 281, 283.1, 283.3, 283.4; 73/574.32, 493

(56) References Cited

U.S. PATENT DOCUMENTS 6,184,865 B1 * 2/2001 Zimmerman et al. ....... 345/160
6,373,265 B1 * 4/2002 Morimoto et al. .......... 324/686

* cited by examiner

Primary Examiner—Vincent Q. Nguyen
(74) Attorney, Agent, or Firm—Whitham, Curtis & Christofferson, PC

(57) ABSTRACT

In an electrostatic capacitance sensor, an electrode is formed on a base board. The electrode is covered with a resist. A conductive rubber includes a first face and a second face. The first face has a fist area and is opposed to the resist. The second face is opposed to the first face. The second face has a second area which is larger that the first area. A flexible click rubber is attached to the second face of the conductive rubber for providing pressure contact of the conductive rubber with respect to the resist.

6 Claims, 5 Drawing Sheets

Related Art

Related Art

Related Art

ELECTROSTATIC CAPACITANCE SENSOR

BACKGROUND OF THE INVENTION

The present invention relates to an electrostatic capacitance sensor, and more particularly to the electrostatic capacitance sensor in which a conductive rubber is abutted against electrodes covered with a resist, thereby to vary electrostatic capacitance of the conductive rubber, and to change output level with the variation of the electrostatic capacitance.

Referring to FIGS. 4 to 7, a related electrostatic capacitance sensor of this type will be described. In FIG. 4, a switch device 1 includes a pair of first electrodes 3 mounted on a base plate 2, and a second electrode 4 in a C-shape as seen in a plan view which is circumferentially arranged around the first electrodes 3 so as to be apart therefrom. The first electrodes 3 and the second electrode 4 are covered with a resist 5, and a pair of carbon electrodes 6 are mounted on an upper face of the resist 5 and above the first electrodes 3.

Moreover, there is provided a click rubber 7 above and opposed to the first electrodes 3 and the second electrode 4. The click rubber 7 has a substantially cylindrical body 8 and a flexible leg 9 extending downwardly from an outer peripheral part of the cylindrical body 8 at a lower end thereof. In addition, a conductive rubber 10 substantially in a disc-like shape is provided in a center part of the lower end of the cylindrical body 8. The conductive rubber 10, the first electrodes 3 and the second electrode 4 constitute an electrostatic capacitance sensor 13. Further, a button 11 is mounted on an upper face of the click rubber 7. An upper cover 12 for covering an upper part of the click rubber 7, the first electrodes 3 and the second electrode 4 is provided to press down at a bottom parts of the flexible leg 9 of the click rubber 7, so that an upper part of the button 11 is projected through an opening 12a which is formed in an upper part of the upper cover 12.

FIGS. 5A and 5B show particulars of the first electrodes 3 and the second electrode 4. The first electrodes 3 are provided in a center of the C-shaped second electrode 4 so as to be apart from each other. The carbon electrodes 6 are mounted above the first electrodes 3 which are covered with the resist 5. Lead lines 14 are respectively connected to the carbon electrodes 6, and the one end of the one lead line 14 is grounded. Moreover, a lead line 15 is connected to the second electrode 4. A two dotted chain line in FIG. 5A represents a range of an area upon which the conductive rubber 10 is brought into contact.

FIG. 6 shows a circuit 16 of the switch device 1. The circuit 16 includes a clock power source 17, resistors 18, 19, an ENOR gate 20 (also known as an exclusive NOR or XNOR gate), and an electrostatic capacitance sensor 13. The electrostatic capacitance sensor 13 is composed of a capacitor 21 and a switch 22 connected in series. The resistors 18, 19 are respectively connected to the clock power source 17. The other end of the resistors 18, 19 are respectively connected to two input terminals of the ENOR gate 20. Then, one end of the electrostatic capacitance sensor 13 is connected to the resistor 18 and the ENOR gate 20, and the other end of the electrostatic capacitance sensor 13 is grounded.

In this state, the capacitor 21 corresponds to a circuit constituted by the conductive rubber 10, the first electrodes 3 and the second electrode 4, while the switch 22 corresponds to a circuit constituted by the conductive rubber 10 and the carbon electrodes 6.

Incidentally, when the button 11 is depressed, the flexible leg 9 of the click rubber 7 is flexed so that the conductive rubber 10 of the click rubber 7 is brought into contact with the carbon electrodes 6 to establish electrical conduction between the carbon electrodes 6. As the button 11 continues to be pushed down, the conductive rubber 10 is pushed against the first electrodes 3 and the second electrode 4 which are covered with the resist 5. According to the pressure contact, the electrostatic capacitance in the conductive rubber 10 is varied so that output from the conductive rubber 10 is thereby changed.

In other words, after the switch 22 has been turned on in the circuit 16, the output of the ENOR gate 20 is changed in accordance with the variation of the electrostatic capacitance of the capacitor 21.

FIG. 7 is a graph showing relationship between pressure of the electrostatic capacitance sensor 13 provided by bringing the conductive rubber 10 into contact with the resist 5 and the output level therefrom. As shown by a solid line, the output level rises substantially in proportion to a rise of the pressure.

However, in FIG. 7, there exists dispersion in the output level for the pressure as shown by dotted lines so that the output levels are deviated from an ideal output levels as shown by solid lines. The dispersion may incur instability of the output level of the electrostatic capacitance sensor 13 so that reliability as the electrostatic capacitance sensor 13 may be deteriorated.

SUMMARY OF THE INVENTION

It is therefore an object of the present invention to provide an electrostatic capacitance sensor in which the dispersion of the output level for the pressure of the electrostatic capacitance sensor is decreased in order to stabilize the output level thereof.

In order to achieve the above object, according to the present invention, there is provided an electrostatic capacitance sensor comprising:

a base board;

an electrode, formed on the base board;

a resist, which covers the electrode;

a conductive rubber, including:
  a first face having a first area, which is opposed to the resist; and
  a second face which is opposed to the first face, the second face having a second area which is larger than the first area; and a flexible click rubber, on which the second face of the conductive rubber is attached, for providing pressure contact of the conductive rubber with respect to the resist.

Preferably, the first face and the second face are parallel with each other, and a sectional area of the conductive rubber perpendicular to a direction in which the pressure contact is provided, is made minimum at the first face.

Here, it is preferable that a form of the conductive rubber is shaped into a frustum.

Preferably, a form of the conductive rubber is shaped into a frustum of a circular cone.

Preferably, a peripheral end portion of the first face of the conductive rubber is chamfered.

According to the present invention, there is also provided an electrostatic capacitance sensor comprising:

a base board;

an electrode, formed on the base board;

a resist, which covers with the electrode;

a conductive rubber, which is shaped into a semispherical shape; and a flexible click rubber, on which a flat face portion of the semispherical conductive rubber is attached, for providing pressure contact of the semispherical conductive rubber with respect to the resist.

In the above configurations, dispersion in the output levels generated with a deformation of the conductive rubber of the electrostatic capacitance sensor can be decreased, and stabilization of the output levels can be attained.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
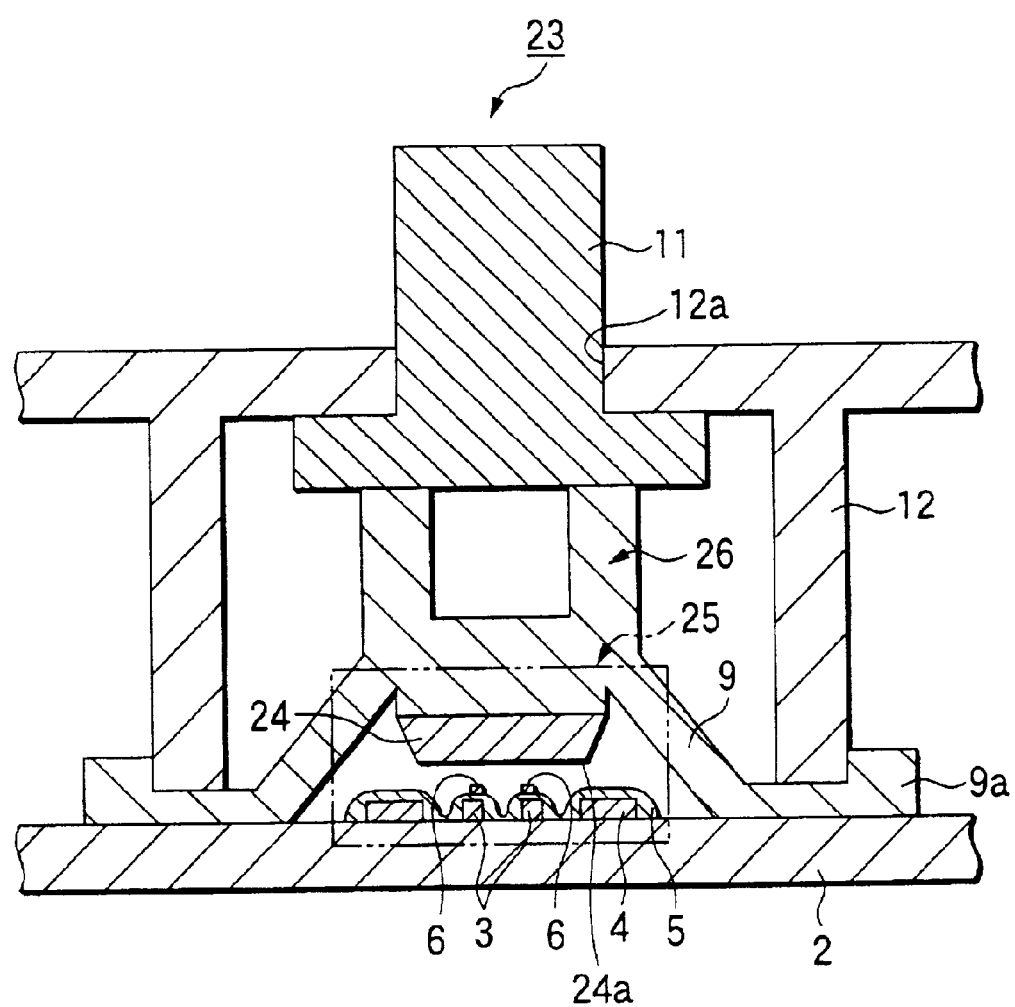
FIG. 1 is a vertical sectional view of a switch device according to the first embodiment of the present invention.

Preferred embodiments of the present invention will be described below in detail referring to FIGS. 1 to 3B. For convenience of explanation, same components as in the related switch device will be denoted with same reference numerals, and their explanation will be omitted. In FIG. 1, a switch device 23 includes a conductive rubber 24 in place of the conductive rubber 10 of the related switch device 1 shown in FIG. 4. An electrostatic capacitance sensor 25 is constituted by the conductive rubber 24, the first electrodes 3 and the second electrode 4. The conductive rubber 24 is formed in such a manner that a sectional area of the conductive rubber 24 in a direction perpendicular to a depressing direction of the button 11 may be at a minimum as pressure contact face 24a. Specifically, a pressure contact portion of the conductive rubber 24 is formed in an inverted shape of a truncated cone.

In this state, when the button 11 is pushed down, the flexible leg 9 of a click rubber 26 provided with the conductive rubber 24 is flexed so that the conductive rubber 24 is brought into contact with the carbon electrodes 6 to establish electrical conduction between the carbon electrodes 6. As the button 11 is further pushed down, the conductive rubber 24 is pressed against the first electrodes 3 and the second electrode 4 which are covered with the resist 5. According to provide the pressure contact of the conductive rubber 24 with respect to the resist 5, the electrostatic capacitance in the conductive rubber 24 varies so that output of the conductive rubber 24 changes.

Figure 2:
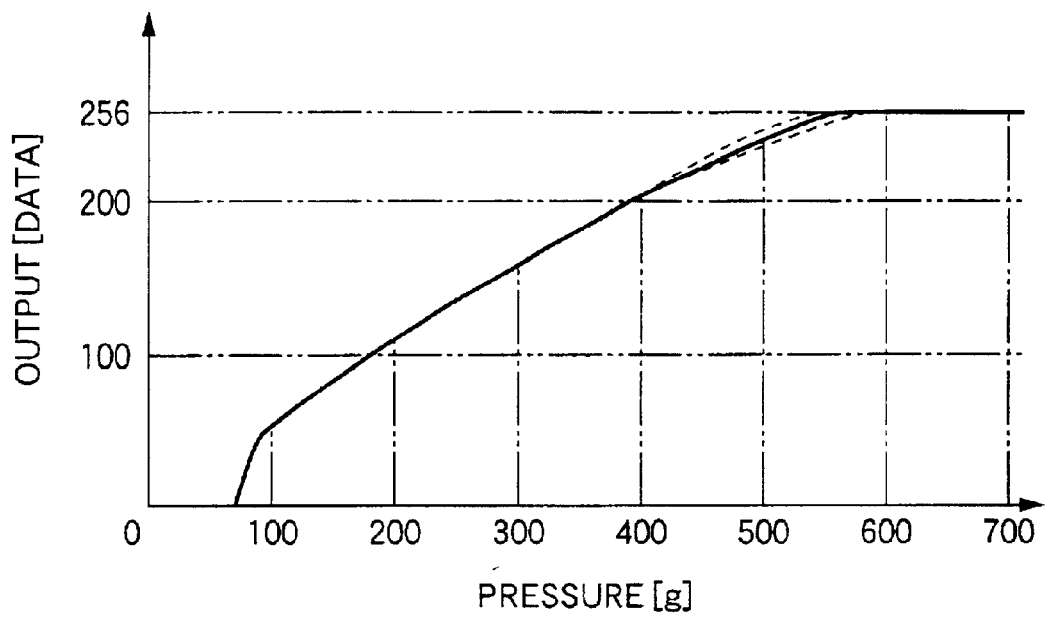
FIG. 2 is a graph showing relationship between pressure and output level of an electrostatic capacitance sensor.

FIG. 2 is a graph showing relationship between pressure and the output level of the electrostatic capacitance sensor 25. Although the output level as shown by a solid line rises substantially in proportion to a rise of the pressure provided by the pressure contact, the increase of the output level for the pressure is rather gentle as compared with that in the related switch device, and the output level for the pressure has relatively less dispersion, as shown by dotted lines in the drawing.

In this manner, the dispersion in the output for the pressure of the electrostatic capacitance sensor 25 will be decreased, and stabilization of the output level can be achieved.

Figure 3A:
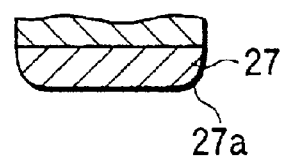
FIG. 3A is a vertical sectional view of a conductive rubber in which a peripheral end portion of a pressure contact portion is chamfered, according to the second embodiment of the present invention.
Figure 4:
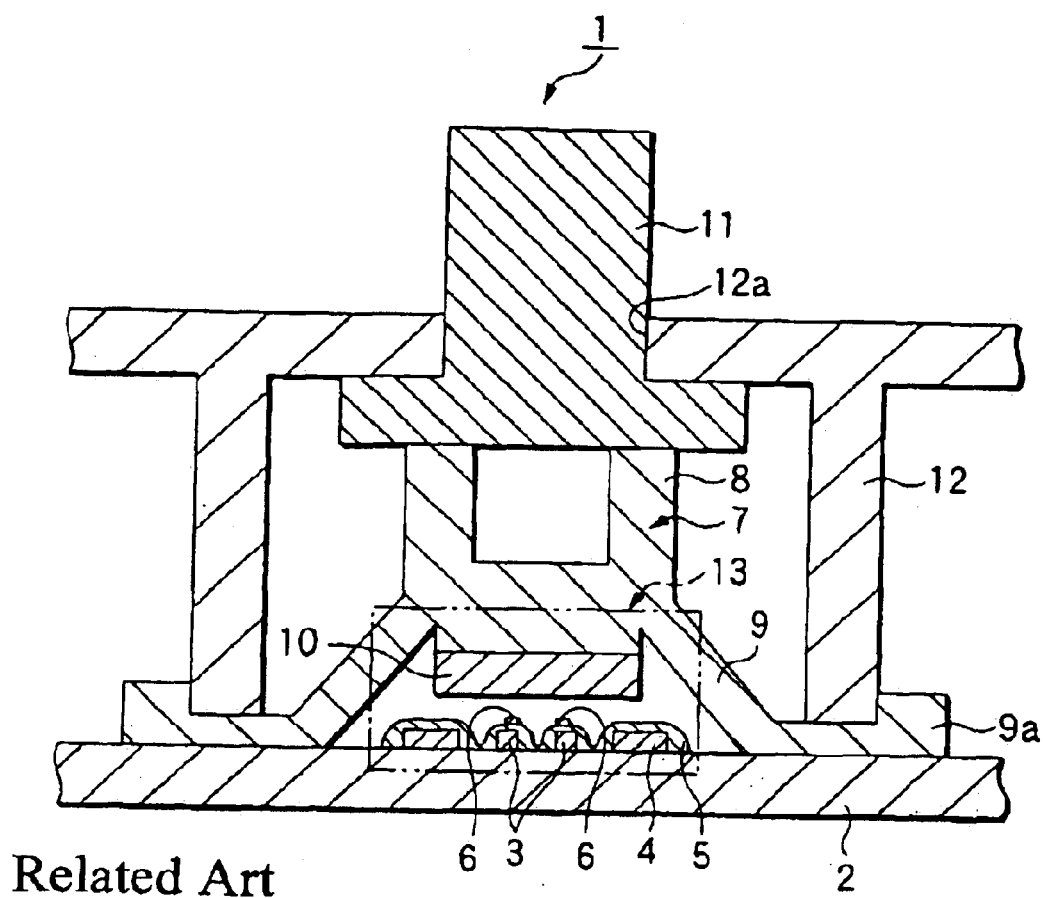
FIG. 4 is a vertical sectional view of a related switch device.
Figure 5A:
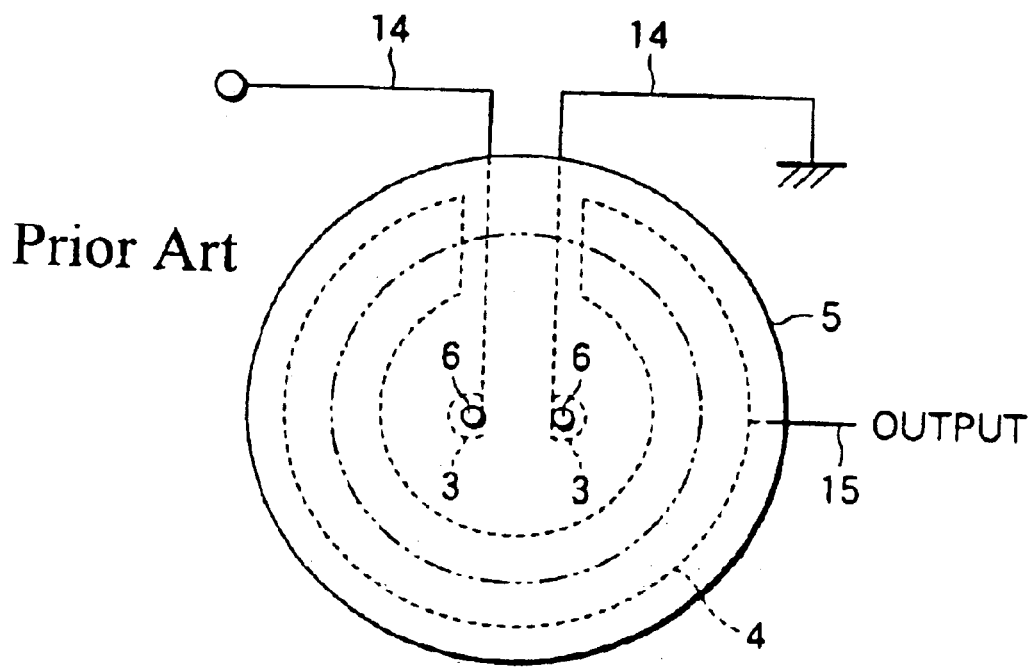
FIG. 5A is a plan view of first electrodes and a second electrode in the related switch device.
Figure 5B:
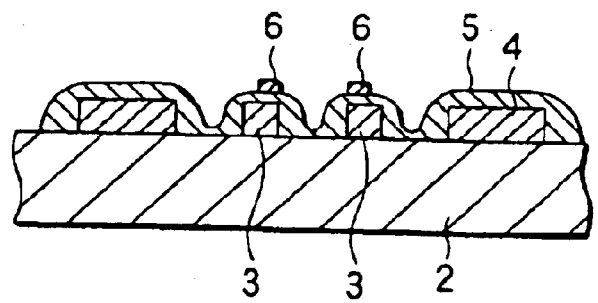
FIG. 5B is a vertical sectional view of the first electrodes and the second electrode in the related switch device.
Figure 6:
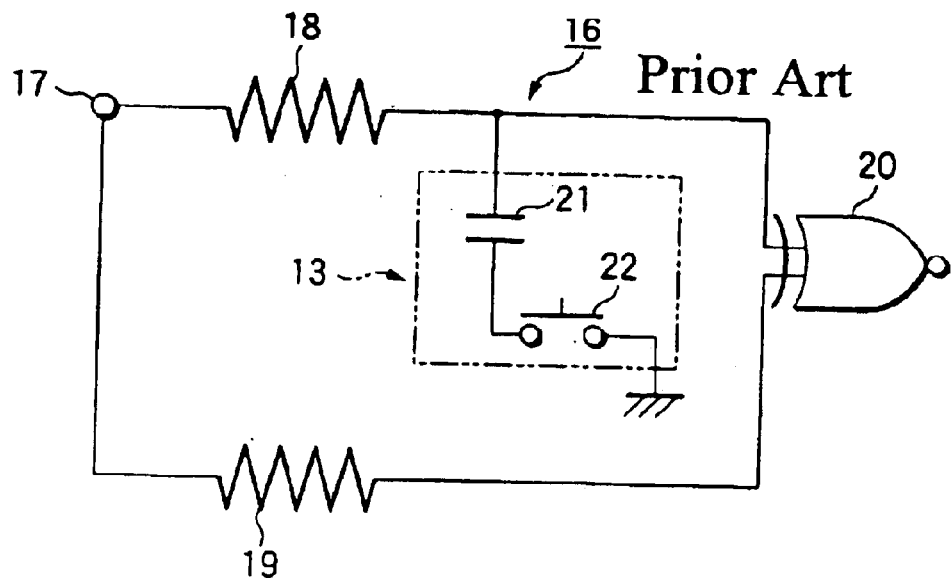
FIG. 6 is a circuit diagram of the related switch device.
Figure 7:
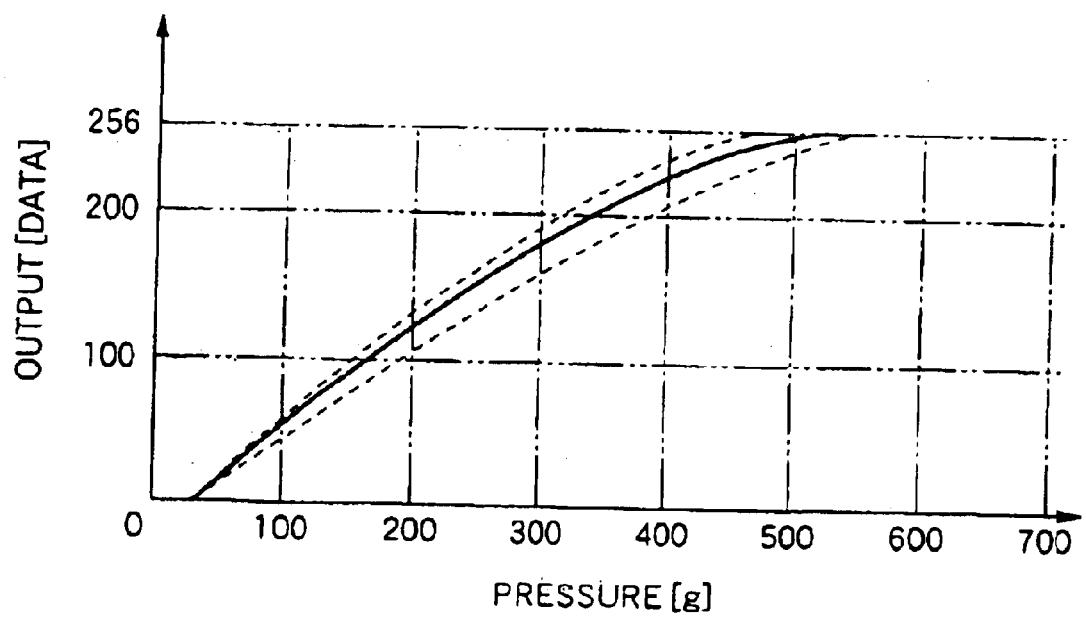
FIG. 7 is a graph showing relationship between pressure and output level of an electrostatic capacitance sensor in the related switch device.

In FIG. 3A, a peripheral end portion of a pressure contact portion of a conductive rubber 27 is formed as a chamfered face 27a. Similar effects to the conductive rubber 24 can be also expected by the conductive rubber 27.

Figure 3B:
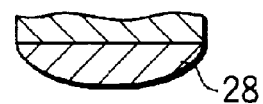
FIG. 3B is a vertical sectional view of a conductive rubber in which the pressure contact portion is formed in a semispherical shape, according to the third embodiment of the present invention.

In FIG. 3B, a pressure contact portion of a conductive rubber 28 is formed in a semispherical shape. Similar effects to the conductive rubber 24 can be also expected by the conductive rubber 28.

Although the present invention has been shown and described with reference to specific preferred embodiments, various changes and modifications will be apparent to those skilled in the art from the teachings herein. Such changes and modifications are obvious and deemed to come within the spirit, scope and contemplation of the invention as defined in the appended claims.

What is claimed is:

1. An electrostatic capacitance sensor comprising:

a base board;

an electrode, formed on the base board;

a resist, which covers the electrode;

a conductive rubber, including:
  a first face having a first area, which is opposed to the resist; and
  a second face which is opposed to the first face, the second face having a second area which is larger than the first area; and a flexible click rubber, on which the second face of the constructive rubber is attached, for providing pressure contact of the first face of the conductive rubber with respect to the resist, wherein the first face of the conductive rubber is parallel to the second face; and wherein a sectional area of the conductive rubber being parallel to the first face of the conductive rubber is gradually decreased toward the first face from the second face.

2. The electrostatic capacitance sensor as set forth in claim 1, wherein a sectional area of the first face of the conductive rubber perpendicular to a direction in which the pressure contact is minimized.

3. The electrostatic capacitance sensor as set forth in claim 1, wherein said conductive rubber is shaped as a frustum.

4. The electrostatic capacitance sensor as set forth in claim 1, wherein said conductive rubber is shaped as a frustum of a circular cone.

5. The electrostatic capacitance sensor as set forth in claim 1 wherein a peripheral end portion of the first face of the conductive rubber is chamfered.

6. An electrostatic capacitance sensor comprising:

a base board;

an electrode, formed on the base board;

a resist, which covers the electrode;

a conductive rubber, which is shaped into a semispherical shape; and a flexible click rubber, on which a flat face portion of the semispherical conductive rubber is attached, for providing pressure contact of a spherical face of the semispherical conductive rubber with respect to the resists, wherein a sectional area of the conductive rubber being parallel to the flat face portion of the conductive rubber is gradually decreased toward a tip of the spherical face from the flat face portion.

\* \* \* \* \*